(12) United States Patent
Yamabi et al.

(10) Patent No.: US 8,970,013 B2
(45) Date of Patent: Mar. 3, 2015

(54) SEMICONDUCTOR LIGHT-RECEIVING ELEMENT

(71) Applicant: Sumitomo Electric Device Innovations, Inc., Yokohama (JP)

(72) Inventors: Ryuji Yamabi, Yokohama (JP); Yoshifumi Nishimoto, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 72 days.

(21) Appl. No.: 13/929,412

(22) Filed: Jun. 27, 2013

(65) Prior Publication Data
US 2014/0001592 A1 Jan. 2, 2014

(30) Foreign Application Priority Data

Jun. 29, 2012 (JP) ................................ 2012-147534

(51) Int. Cl.
*H01L 29/06* (2006.01)
*H01L 21/00* (2006.01)
*H01L 31/02* (2006.01)
*H01L 31/109* (2006.01)
*H01L 31/0224* (2006.01)

(52) U.S. Cl.
CPC .... *H01L 31/02002* (2013.01); *H01L 31/02005* (2013.01); *H01L 31/109* (2013.01); *H01L 31/022416* (2013.01)
USPC .............. 257/623; 257/626; 438/31; 385/132

(58) Field of Classification Search
None
See application file for complete search history.

(56) References Cited

U.S. PATENT DOCUMENTS

| 6,667,529 B2* | 12/2003 | Takagi .......................... 257/488 |
| 8,618,638 B2* | 12/2013 | Yoneda et al. ................ 257/623 |
| 2008/0197377 A1* | 8/2008 | Sudo et al. ...................... 257/99 |

FOREIGN PATENT DOCUMENTS

| JP | 62-84522 A | 4/1987 |
| JP | 4-290477 | 10/1992 |
| JP | 2009-004812 A | 1/2009 |

OTHER PUBLICATIONS

Notification of Reasons for Refusal in Japanese Patent Application No. 2012-147534, dated Apr. 30, 2014.

* cited by examiner

*Primary Examiner* — Sonya D McCall Shepard
(74) *Attorney, Agent, or Firm* — Venable LLP; Michael A. Sartori

(57) ABSTRACT

A semiconductor light-receiving element includes: a light-receiving portion that is provided on a semi-insulating substrate and has a mesa shape in which semiconductor layers are laminated; a lamination structure of insulating films that is provided on a part of a side face of the light-receiving portion and has a structure in which a first insulating film comprised of a silicon nitride film, a second insulating film comprised of a silicon oxynitride film and a third insulating film comprised of a silicon nitride film are laminated in contact with each other; and a resin film that is provided adjacent to the light-receiving portion, the resin film being sandwiched in or between any of the first insulating film, the second insulating film and the third insulating film.

10 Claims, 5 Drawing Sheets

SEMICONDUCTOR LIGHT-RECEIVING ELEMENT

CROSS-REFERENCE TO RELATED APPLICATION

This application is based upon and claims the benefit of priority of the prior Japanese Patent Application No. 2012-147534, filed on Jun. 29, 2012, the entire contents of which are incorporated herein by reference.

BACKGROUND (i) Technical Field

The present invention relates to a semiconductor light-receiving element.

(ii) Related Art

Japanese Patent Application Publication No. 04-290477 discloses a semiconductor light-receiving element in which an electrode pad that is electrically connected to a semiconductor layer structuring a mesa-shaped light-receiving portion is provided on a dummy mesa that is different from the mesa of the light-receiving portion.

SUMMARY

It is an object to provide a semiconductor light-receiving element in which stress applied to a light-receiving portion is reduced.

According to an aspect of the present invention, there is provided a semiconductor light-receiving element including: a light-receiving portion that is provided on a semi-insulating substrate and has a mesa shape in which semiconductor layers are laminated; a lamination structure of insulating films that is provided on a part of a side face of the light-receiving portion and has a structure in which a first insulating film comprised of a silicon nitride film, a second insulating film comprised of a silicon oxynitride film and a third insulating film comprised of a silicon nitride film are laminated in contact with each other; and a resin film that is provided adjacent to the light-receiving portion, the resin film being sandwiched in or between any of the first insulating film, the second insulating film and the third insulating film.

DETAILED DESCRIPTION

A semiconductor layer structuring a mesa-shaped light-receiving portion is electrically connected to an electrode pad on a dummy mesa (hereinafter referred to as an electrode connection portion) via an interconnection line. In the structure, a structure in which a resin film having a low dielectric constant is buried between the light-receiving portion and the electrode connection portion has been reviewed in order to reduce a parasitic capacity of the interconnection line. With the structure, the interconnection line can be provided on the resin film. Therefore, the parasitic capacity of the interconnection line can be reduced.

It is thought that an insulating film is provided on and under the resin film in order to protect the resin film buried between the light-receiving portion and the electrode connection portion and improve adhesiveness between the resin film and other layers. The insulating film is, for example, a silicon nitride film. The structure can be made when a first silicon nitride film is formed on a whole face, a resin film is buried on the first silicon nitride film between the light-receiving portion and the electrode connection portion, and a second silicon nitride film is formed on a whole face so as to cover the resin film.

However, in this case, the first silicon nitride film and the second silicon nitride film are formed on a portion of a side face of the light-receiving portion other than another portion covered by the resin film. Therefore, a total of an internal stress of the first nitride film and an internal stress of the second nitride film is applied to the light-receiving portion. A direction of the internal stress of the first silicon nitride film is the same as that of the second silicon nitride film. Therefore, a large stress is applied to the light-receiving portion because the internal stresses are added. This results in a fluctuation of light-receiving characteristics.

A description will be given of a best mode for carrying the present invention.

Figure 1:
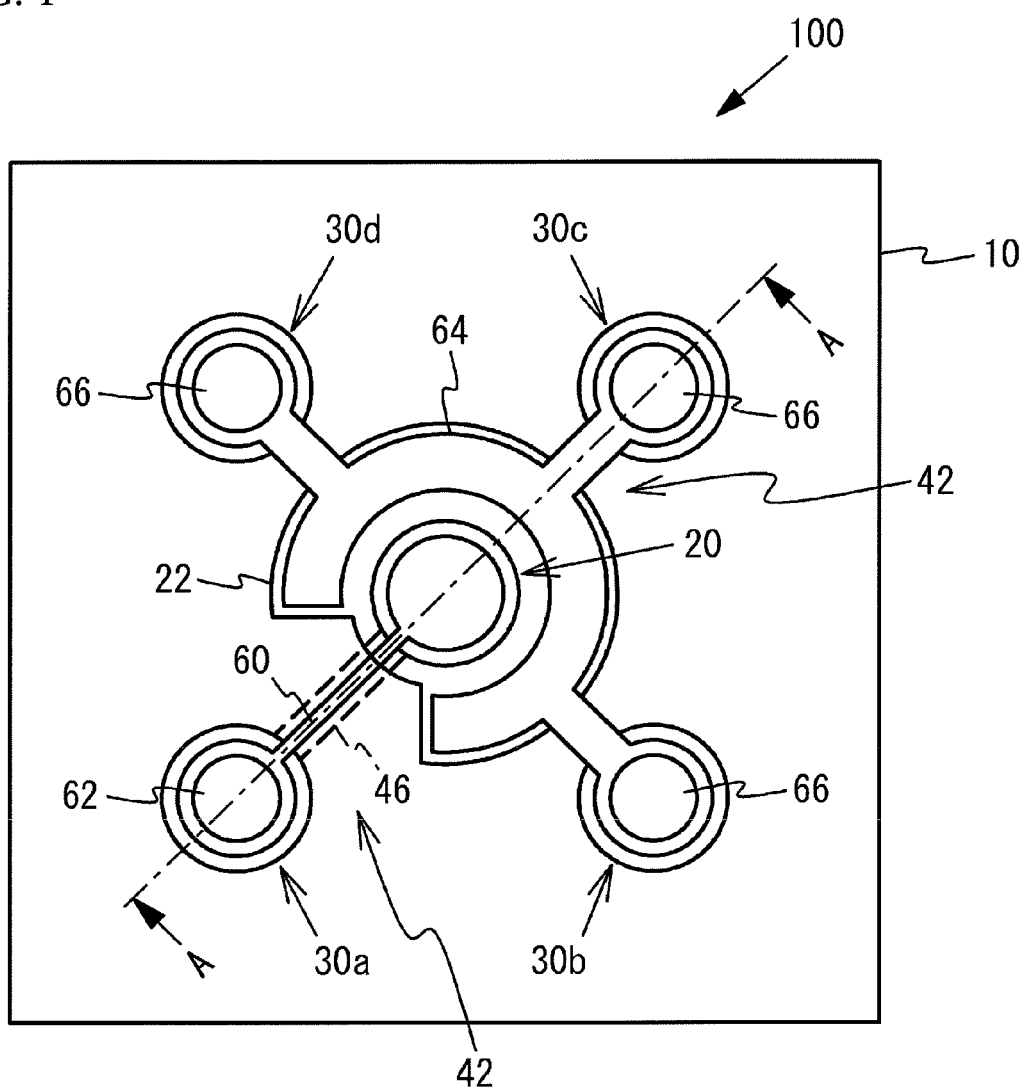
FIG. 1 illustrates a top view of a semiconductor light-receiving element in accordance with an embodiment.
Figure 2:
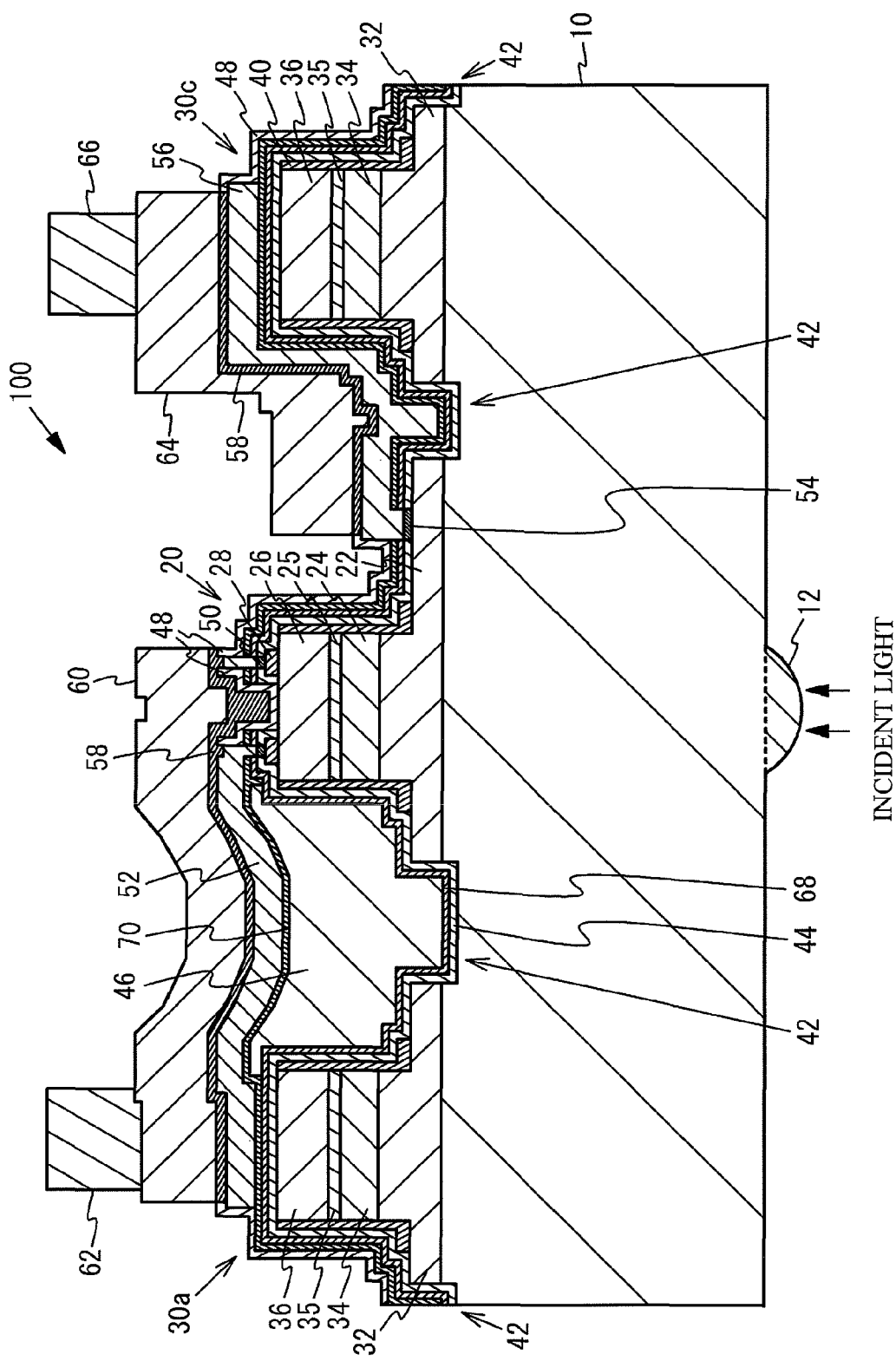
FIG. 2 illustrates a cross sectional view taken along a line A-A of FIG. 1.

A semiconductor light-receiving element in accordance with an embodiment is a back-face incident type semiconductor light-receiving element. FIG. 1 illustrates a top view of the semiconductor light-receiving element in accordance with the embodiment. FIG. 2 illustrates a cross sectional view taken along a line A-A of FIG. 1. As illustrated in FIG. 1 and FIG. 2, a semiconductor light-receiving element 100 in accordance with the embodiment has a structure in which a mesa-shaped light-receiving portion 20 is, for example, provided on an InP substrate 10. The light-receiving portion 20 has a structure in which an n-type InP layer 22, an n-type InGaAs layer 24, an n-type InGaAsP layer 25 and a p-type InP layer 26 are laminated on the InP substrate 10 in this order. A ring-shaped p-type InGaAs layer 28 is provided on the p-type InP layer 26. The n-type InGaAs layer 24 acts as a light absorption layer.

Four electrode connection portions 30a to 30d having a mesa shape are provided adjacent to the light-receiving portion 20 on the InP substrate 10. The four electrode connection portions 30a to 30d are respectively provided on each corner of a square of which center is an area where the light-receiving portion 20 is provided. The electrode connection portions 30a to 30d have a structure in which an n-type InP layer 32, an n-type InGaAs layer 34, an n-type InGaAsP layer 35 and a p-type InP layer 36 are laminated on the InP substrate 10 in this order. The electrode connection portions 30a to 30d have the same type semiconductor-layer-structure as the light-receiving portion 20. However, the electrode connection portions 30a to 30d do not act as a light-receiving portion that receives an incident light.

A non-doped InP layer 40 is provided so as to cover a side face of the light-receiving portion 20 and side faces of the electrode connection portions 30a to 30d. A thickness of the non-doped InP layer 40 is, for example, 0.4 μm. The non-doped InP layer 40 acts as a passivation film for suppressing a dark current based on a leak current of the side face of the mesa-shaped light-receiving portion 20.

A lens 12 is provided on a region of a lower face of the InP substrate 10 corresponding to the light-receiving portion 20. Thus, a light incoming from the lower face of the InP substrate 10 and collected by the lens 12 enters the light-receiving portion 20. The n-type InGaAs layer 24 absorbs the light. The n-type InGaAs layer 24 absorbs not only the light propagating from the InP substrate 10 toward the n-type InGaAs layer 24 but also a light having passed the n-type InGaAs layer 24 and reflected by a metal layer 58 described later. Therefore, an absorption efficiency is high.

A groove 42 is formed on the InP substrate 10 around the light-receiving portion 20 and the electrode connection portions 30a to 30d. The groove 42 separates the n-type InP layer 22 structuring the light-receiving portion 20 from the n-type InP layer 32 structuring the electrode connection portions 30a to 30d.

A first silicon nitride film 44 acting as a first insulating film (hereinafter referred to as a first SiN film) covers the upper faces and the side faces of the light-receiving portion 20 and the electrode connection portions 30a to 30d and an inner face of the groove 42 and so on. A thickness of the first SiN film 44 is, for example, 0.2 µm. An internal stress of the first SiN film 44 is a tensile stress in a usage temperature range of the semiconductor light-receiving element 100 (for example, −10 degrees C. to 80 degrees C.).

A first silicon oxynitride film (hereinafter referred to as a first SiON film) 68 structuring a second insulating film is provided along an upper face of the first SiN film 44. That is, the first SiON film 68 also covers the upper faces and the side faces of the light-receiving portion 20 and the electrode connection portions 30a to 30d and the inner face of the groove 42 and so on, as well as the first SiN film 44. A thickness of the first SiON film 68 is, for example, 0.05 µm. An internal stress of the first SiON film 68 is a compression stress in the usage temperature range of the semiconductor light-receiving element 100 (for example, −10 degrees C. to 80 degrees C.).

A resin film 46 is provided on the first SiON film 68 between the light-receiving portion 20 and the electrode connection portion 30a and is buried in the groove 42. That is, the resin film 46 is adjacent to the light-receiving portion 20, and is provided on the InP substrate 10 on one side of the light-receiving portion 20. The resin film 46 is made of polyimide or the like. An internal stress of the resin film 46 is a tensile stress in the usage temperature range of the semiconductor light-receiving element 100 (for example, −10 degrees C. to 80 degrees C.). The first SiN film 44 and the first SiON film 68 are provided between the resin film 46 and a semiconductor layer such as the non-doped InP layer 40. Therefore, adhesiveness between the resin film 46 and the semiconductor layer can be improved. The first SiN film 44 and the first SiON film 68 also act as a passivation film protecting the semiconductor layer.

A second silicon oxynitride film (hereinafter referred to as a second SiON film) 70 structuring a second insulating film covers the upper faces of the light-receiving portion 20 and the electrode connection portions 30a to 30d, a portion of the side faces of the light-receiving portion 20 and the electrode connection portions 30a to 30d without the resin film 46, and the upper face of the resin film 46. A thickness of the second SiON film 70 is, for example, 0.15 µm. An internal stress of the second SiON film 70 is a compression stress in the usage temperature range of the semiconductor light-receiving element 100 (for example, −10 degrees C. to 80 degrees C.). The second SIGN film 70 is provided on the resin film 46. Therefore, the resin film 46 can be protected, and adhesiveness between a p-side interconnection line 52 described later and the resin film 46 can be improved. In a region of the light-receiving portion 20 where the resin film 46 is not provided, the second insulating film has a two-layer structure in which the first SiON film 68 and the second SiON film 70 are laminated in contact with each other.

The second SiON film 70, the first SiON film 68 and the first SiN film 44 are provided on the upper face of the light-receiving portion 20. A p-side ohmic electrode 50 having a ring shape is provided on an upper face of the p-type InGaAs layer 28. The p-side ohmic electrode 50 is, for example, a lamination structure in which Pt (platinum), Ti (titanium), Pt (platinum), and Au (gold) are laminated in this order from the p-type InGaAs layer 28 side. A thickness of the Pt and Ti is, for example, 0.02 µm. A thickness of Au is, for example, 0.1 µm.

The p-side interconnection line 52 is provided in contact with the upper face of the p-side ohmic electrode 50. The p-side interconnection line 52 extends on the second SiON film 70 from the upper portion of the light-receiving portion 20 to the upper portion of the electrode connection portion 30a via above the resin film 46. The p-side interconnection line 52 is in contact with the upper face of the p-side ohmic electrode 50. Therefore, the p-side interconnection line 52 has a ring shape. The p-side interconnection line 52 has a lamination structure in which Ti (titanium), Pt (platinum) and Au (gold) are laminated in this order from the second SiON film 70 side. A thickness of Ti is, for example, 0.05 µm. A thickness of Pt is, for example, 0.03 µm. A thickness of Au is, for example, 0.5 µm.

A circular opening of which center is the light-receiving portion 20 extends through the second SiON film 70, the first SiON film 68 and the first SiN film 44 between the light-receiving portion 20 and the electrode connection portions 30b to 30d. An n-side ohmic electrode 54 is buried in the opening and is in contact with the n-type InP layer 22. The n-side ohmic electrode 54 is, for example, a lamination structure in which AuGe (gold-germanium) and Ni (nickel) are laminated in this order from the n-type InP layer 22 side. A thickness of the lamination structure of AuGe and Ni is, for example, 0.13 µm.

An n-side interconnection line 56 is provided in contact with an upper face of the n-side ohmic electrode 54. The n-side interconnection line 56 covers the n-side ohmic electrode 54 and has a region having the same circular shape as the n-side ohmic electrode 54. The n-side interconnection line 56 is a lamination structure having the same materials as the p-side interconnection line 52. The n-side interconnection line 56 extends on the second SiON film 70 from an upper portion of the n-side ohmic electrode 54 to the upper portion of the electrode connection portions 30b to 30d.

A second silicon nitride film (hereinafter referred to as a second SiN film) 48 acting as a third insulating film is provided above a region of the InP substrate 10 except for above the p-side interconnection line 52 and above the n-side interconnection line 56. That is, the second SiN film 48 covers a part of the side face of the light-receiving portion 20 without the resin film 46, the side faces of the electrode connection portions 30a to 30d and so on. Therefore, the second SiN film 48 is a passivation film protecting a whole of the semiconductor light-receiving element 100. The second SiN film 48 is buried in an opening extending through the second SiON film 70, the first SiON film 68 and the first SiN film 44 inside of the p-type InGaAs layer 28 having the ring shape on the light-receiving portion 20. That is, the first SiN film 44, the first SiON film 68 and the second SiON film 70 are not provided on the upper face of the light-receiving portion 20. The upper face of the light-receiving portion 20 has a region where only the second SiN film 48 is provided. A thickness of the second SiN film 48 is, for example, 0.21 μm. An internal stress of the second SiN film 48 is a tensile stress in the usage temperature range of the semiconductor light-receiving element 100 (for example, −10 degrees C. to 80 degrees C.).

The metal layer 58 is provided in contact with an upper face of the p-side interconnection line 52 and an upper face of the n-side interconnection line 56. The metal layer 58 is also provided on the second SiN film 48 inside of the p-type InGaAs layer 28. Therefore, the metal layer 58 acts as a reflection film for reflecting a light incoming from the lower face side of the InP substrate 10, as described above. The light reflected by the metal layer 58 passes through the second SiN film 48. In view of the passage of the light, it is preferable that the film between the metal layer 58 and the p-type InP layer 26 is a silicon nitride film. The metal layer 58 is, for example, made of Au (gold). A thickness of Au is, for example, 0.2 μm.

A p-side plated interconnection line 60 is provided in contact with an upper face of the metal layer 58 on the p-side interconnection line 52. The p-side plated interconnection line 60 is, for example, made of a plated Au. A thickness of the p-side plated interconnection line 60 is, for example, 1.5 μm. A p-electrode pad 62 is provided in contact with an upper face of the p-side plated interconnection line 60 on the electrode connection portion 30a. The p-electrode pad 62 is, for example, made of a plated Au. A thickness of the p-electrode pad 62 is, for example, 6.0 μm. The p-electrode pad 62 is electrically connected to the p-side InP layer 26 via the p-side plated interconnection line 60, the metal layer 58, the p-side interconnection line 52 and the p-side ohmic electrode 50.

An n-side plated interconnection line 64 is provided in contact with the upper face of the metal layer 58 on the n-side interconnection line 56. The n-side plated interconnection line 64 is, for example, made of the same material as the p-side plated interconnection line 60. An n-electrode pad 66 is provided in contact with the upper face of the n-side plated interconnection line 64 on the electrode connection portions 30b to 30d. The n-electrode pad 66 is, for example, made of the same material as the p-electrode pad 62. The n-electrode pad 66 is electrically connected to the n-type InP layer 22 via the n-side plated interconnection line 64, the metal layer 58, the n-side interconnection line 56 and the n-side ohmic electrode 54.

Figure 3A:
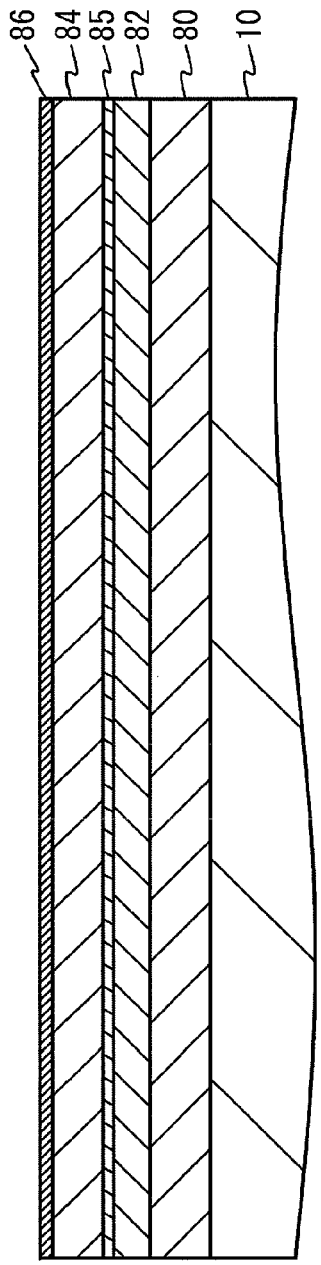
FIG. 3A to FIG. 3C illustrate a cross sectional view for describing a manufacturing method of the semiconductor light-receiving element in accordance with the embodiment.

Next, a description will be given of a manufacturing method of the semiconductor light-receiving element in accordance with the embodiment. FIG. 3A through FIG. 5B illustrate a cross sectional view for describing the manufacturing method of the semiconductor light-receiving element in accordance with the embodiment. As illustrated in FIG. 3A, an n-type InP layer 80, an n-type InGaAs layer 82, an n-type InGaAsP layer 85, a p-type InP layer 84 and a p-type InGaAs layer 86 are formed in this order on the InP substrate 10. For example, an MOCVD (Metal Organic Chemical Vapor Deposition) method may be used as the formation method of each semiconductor layer.

Figure 3B:
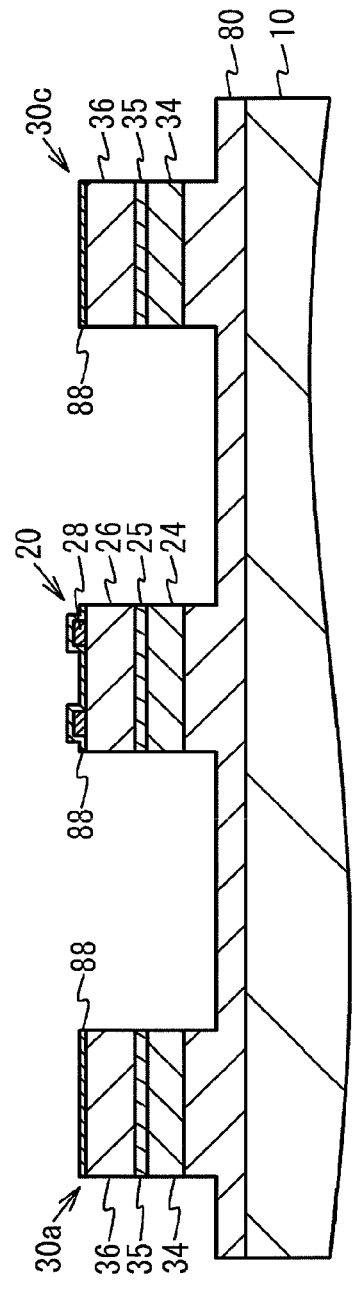

As illustrated in FIG. 3B, the p-type InGaAs layer 86 is subjected to an etching process. Thus, the p-type InGaAs layer 28 having a ring shape is left in a region where the light-receiving portion 20 is to be formed. A dry etching method such as an RIE (Reactive Ion Etching) or a wet etching method may be used as the etching process. The dry etching method or the wet etching method may be used as an etching process described later.

After forming the p-type InGaAs layer 28 having the ring shape, a mask layer 88 is formed so as to cover regions where the light-receiving portion 20 and the electrode connection portions 30a to 30d are to be formed. A part of the p-type InP layer 84, a part of the n-type InGaAsP layer 85, a part of the n-type InGaAs layer 82, and a part of the n-type InP layer 80 are subjected to an etching process with use of the mask layer 88 as a mask. Thus, the mesa-shaped light-receiving portion 20 having the n-type InP layer 80, the n-type InGaAs layer 24, the n-type InGaAsP layer 25 and the p-type InP layer 26 is formed. The n-type InGaAs layer 82 acts as the n-type InGaAs layer 24. The n-type InGaAsP layer 85 acts as the n-type InGaAsP layer 25. The p-type InP layer 84 acts as the p-type InP layer 26. And, the mesa-shaped electrode connection portions 30a to 30d having the n-type InP layer 80, the n-type InGaAs layer 34, the n-type InGaAsP layer 35 and the p-type InP layer 36 are formed. The n-type InGaAs layer 82 acts as the n-type InGaAs layer 34. The n-type InGaAsP layer 85 acts as the n-type InGaAsP layer 35. The p-type InP layer 84 acts as the p-type InP layer 36. In this stage, the n-type InP layer 80 extends from the light-receiving portion 20 to the electrode connection portions 30a to 30d.

Figure 3C:
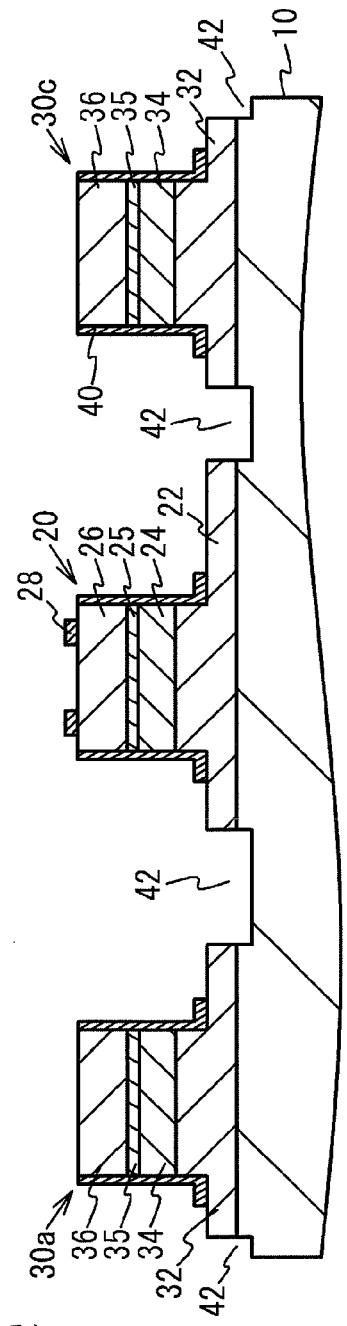

As illustrated in FIG. 3C, a non-doped InP layer is formed on the InP substrate 10 with use of the mask layer 80 as a mask. For example, the MOCVD method may be used as the formation method of the non-doped InP layer. The mask layer 88 is removed. After that, the non-doped InP layer is subjected to an etching process. Thus, the non-doped InP layer 40 is remained so as to cover the side face of the light-receiving portion 20 and the side face of the electrode connection portions 30a to 30d. A part of the n-type InP layer 80 and a part of the InP substrate 10 are subjected to an etching process. Thus, the groove 42 is formed on the InP substrate 10 around the light-receiving portion 20 and the electrode connection portions 30a to 30d. The groove 42 separates the n-type InP layer of the light-receiving portion 20 from the n-type InP layer of the electrode connection portions 30a to 30d. The n-type InP layer of the light-receiving portion 20 acts as the n-type InP layer 22. The n-type InP layer of the electrode connection portions 30a to 30d acts as the n-type InP layer 32. Thus, the InP substrate 10 having the mesa-shaped light-receiving portion 20 in which semiconductor layers are laminated and the mesa-shaped electrode connection portions 30a to 30d in which semiconductor layers having the same structure as the light-receiving portion 20 are laminated are made.

Figure 4A:
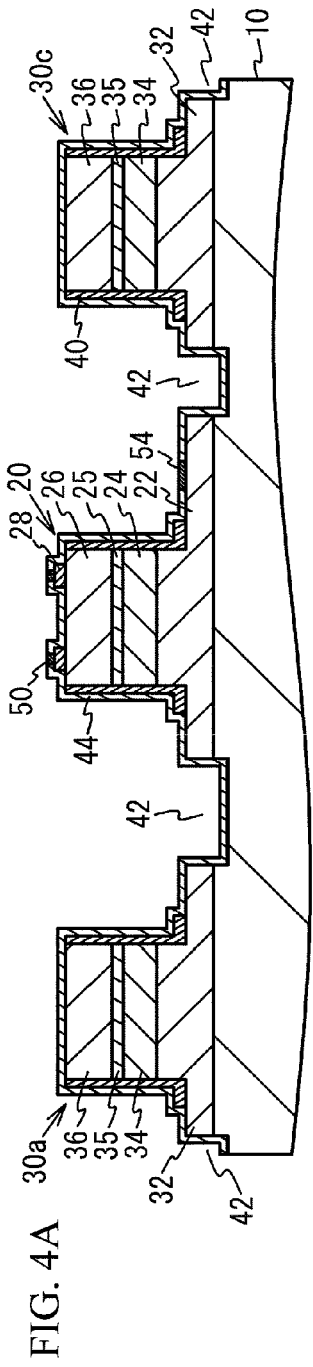
FIG. 4A to FIG. 4C illustrate a cross sectional view for describing the manufacturing method of the semiconductor light-receiving element in accordance with the embodiment.

As illustrated in FIG. 4A, the first SiN film 44 is formed on a whole face of the InP substrate 10. For example, a plasma CVD (Chemical Vapor Deposition) method may be used as the formation method of the first SiN film 44. Formation conditions are as follows, for example.

Material gas: Silane ($SiH_4$), Ammonia ($NH_3$), and Nitrogen ($N_2$)
Pressure: 700 Pa
Temperature: 270 degrees C.
RF power: 50 W Thus, the first SiN film 44 is formed so as to cover the upper faces and the side faces of the light-receiving portion 20 and the electrode connection portions 30a to 30d and cover the InP substrate 10 between the light-receiving portion 20 and the electrode connection portions 30a to 30d. The internal stress of the first SiN film 44 is a tensile stress in the usage temperature range of the semiconductor light-receiving element (for example, −10 degrees C. to 80 degrees C.). After that, the first SiN film 44 on the p-type InGaAs layer 28 and the n-type InP layer 22 is subjected to an etching process, and an opening is formed in the first SiN film 44. A metal film is buried in the opening with use of a vapor deposition method and a lift-off method. Thus, the p-side ohmic electrode 50 that is in contact with the upper face of the p-type InGaAs layer 28 and is electrically connected to the p-type InP layer 26 is formed. The n-side ohmic electrode 54 that is in contact with the upper face of the n-type InP layer 22 and is electrically connected to the n-type InP layer 22 is formed.

Figure 4B:
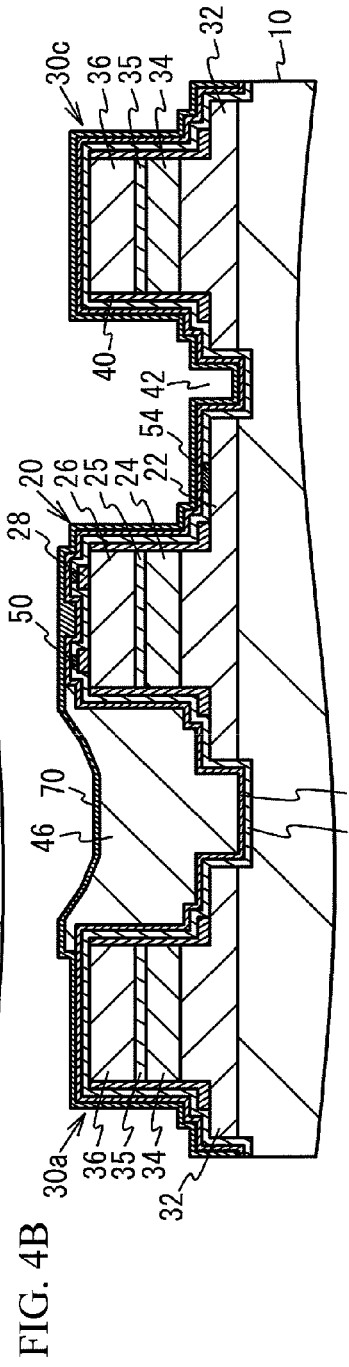

As illustrated in FIG. 4B, the first SiON film 68 is formed on a whole face of the InP substrate 10. For example, a plasma CVD (Chemical Vapor Deposition) method may be used as the formation method of the first SiON film 68. Formation conditions are as follows, for example.

Material gas: Silane, Ammonia, Nitrogen, and oxide nitrogen ($N_2O$)
Pressure: 900 Pa
Temperature: 270 degrees C.
RF power: 20 W Thus, the first SiON film 68 is formed along the upper face of the first SiN film 44. The first SiON film 68 is formed so as to cover the upper faces and the side faces of the light-receiving portion 20 and the electrode connection portions 30a to 30d and cover the InP substrate 10 between the light-receiving portion 20 and the electrode connection portions 30a to 30d, as well as the first SiN film 44. The first SiON film 68 is formed so as to cover the p-side ohmic electrode 50 and the n-side ohmic electrode 54. The internal stress of the first SiON film 68 is a tensile stress in the usage temperature range of the semiconductor light-receiving element (for example, −10 degrees C. to 80 degrees C.).

After forming the first SiON film 68, the resin film 46 made of polyimide is buried on the first SiON film 68 between the light-receiving portion 20 and the electrode connection portion 30a. The resin film 46 can be buried between the light-receiving portion 20 and the electrode connection portion 30a when a resin film is formed on a whole face of the InP substrate 10 and an etching process is performed so that only a part of the resin film between the light-receiving portion 20 and the electrode connection portion 30a is left. An internal stress of the resin film 46 is a tensile stress in the usage temperature range of the semiconductor light-receiving element (−10 degrees C. to 80 degrees C.).

After burying the resin film 46, the second SiON film 70 is formed on the whole face of the InP substrate 10. For example, a plasma CVD (Chemical Vapor Deposition) method may be used as the formation method of the second SiON film 70.

Formation conditions are as follows, for example.
Material gas: Silane, Ammonia, Nitrogen, and oxide nitrogen
Pressure: 900 Pa
Temperature: 270 degrees C.
RF power: 20 W Thus, the second SiON film 70 is formed so as to cover the upper faces and the side faces of the light-receiving portion 20 and the electrode connection portions 30a to 30d, the upper face of the resin film 46 and so on. And, the second SiON film 70 is formed on the p-side ohmic electrode 50 and the n-side ohmic electrode 54. The internal stress of the second SiON film 70 is a compression stress in the usage temperature range of the semiconductor light-receiving element (for example, −10 degrees C. to 80 degrees C.).

Figure 4C:
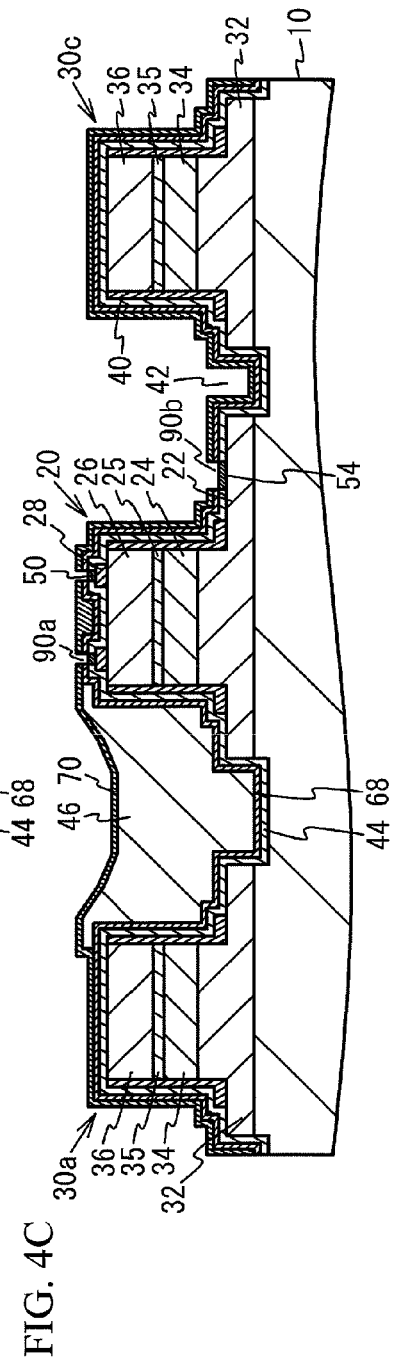

As illustrated in FIG. 4C, the second SiON film 70 and the first SiON film 68 on the p-side ohmic electrode 50 and the n-side ohmic electrode 54 are subjected to an etching process. And, an opening 90a through which the p-side ohmic electrode 50 is exposed and an opening 90b through which the n-side ohmic electrode 54 is exposed are formed. The openings 90a and 90b can be formed by an etching process with use of an identical mask, because both the second SiON film 70 and the first SiON film 68 are made of SiON.

Figure 5A:
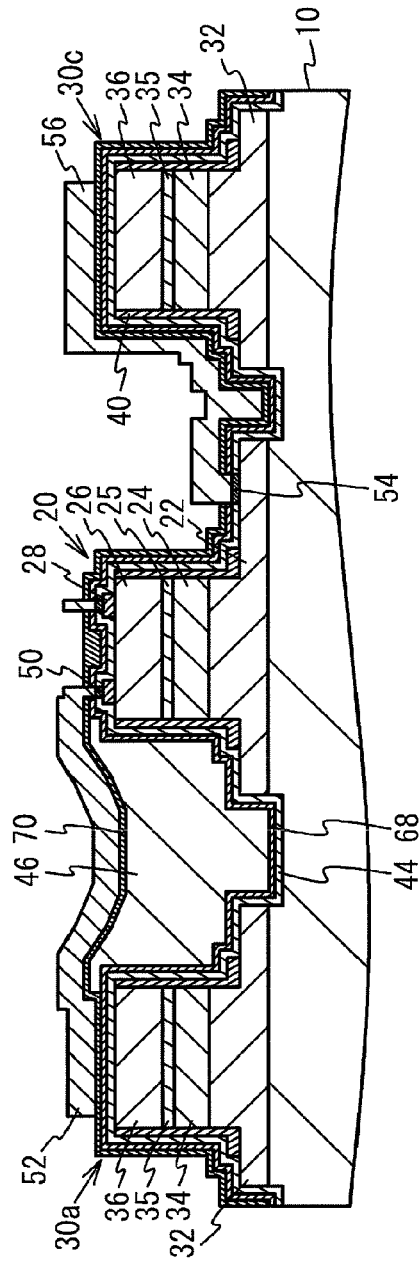
FIG. 5A and FIG. 5B illustrate a cross sectional view for describing the manufacturing method of the semiconductor light-receiving element in accordance with the embodiment.

As illustrated in FIG. 5A, the p-side interconnection line 52 that is buried in the opening 90a, is in contact with the upper face of the p-side ohmic electrode 50 and extends to above the electrode connection portion 30a via above the resin film 46 is formed by a vapor deposition method and a lift-off method or the like. Together with the p-side interconnection line 52, the n-side interconnection line 56 that is buried in the opening 90b, is in contact with the upper face of the n-side ohmic electrode 54 and extends to above the electrode connection portions 30b to 30d is formed.

Figure 5B:
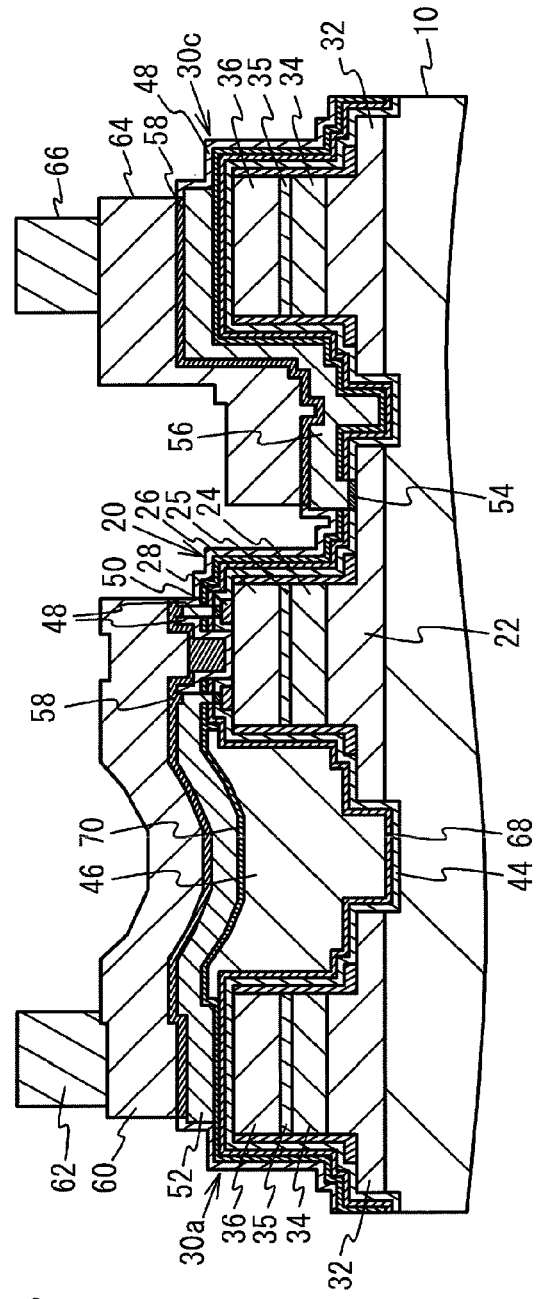

As illustrated in FIG. 5B, the second SiON film 70, the first SiON film 68 and the first SiN film 44 inside of the p-type InGaAs layer 28 having a ring shape are subjected to an etching process. Thereby, an opening is formed. After that, the second SiN film 48 is formed on the whole face of the InP substrate 10. For example, a plasma CVD method may be used as the formation method of the second SiN film 48. Formation conditions are as follows, for example.

Material gas: Silane, Ammonia, and Nitrogen
Pressure: 700 Pa
Temperature: 270 degrees C.
RF power: 50 W Thus, the second SiN film 48 is formed so as to cover the upper face and the side face of the light-receiving portion 20 and the side faces of the electrode connection portions 30a to 30d. And, the second SiN film 48 is formed in contact with the upper face of the light-receiving portion 20 (that is, the upper face of the p-type InP layer 26) inside of the p-type InGaAs layer 28 having a ring shape. The internal stress of the second SiN film 48 is a tensile stress in the usage temperature range of the semiconductor light-receiving element (for example, −10 degrees C. to 80 degrees C.).

After forming the second SiN film 48, the second SiN film 48 on the p-side interconnection line 52 and the second SiN film 48 on the n-side interconnection line 56 are subjected to an etching process and are removed. After that, the metal layer 58 is formed on the upper face of the p-side interconnection line 52 and the upper face of the n-side interconnection line 56 by a sputtering method or the like. The metal layer 58 is also formed on the second SiN film 48 formed inside of the p-type InGaAs layer 28 having a ring shape.

After forming the metal layer 58, the p-side plated interconnection line 60 is formed on an upper face of the metal layer 58 on the p-side interconnection line 52 by an electrolytic plating method or the like. Together with the p-side plated interconnection line 60, the n-side plated interconnection line 64 is formed on the upper face of the metal layer 58 on the n-side interconnection line 56. After that, for example, the p-electrode pad 62 is formed on an upper face of the p-side plated interconnection line 60 on the electrode connection portion 30a by an electrolytic plating method or the like. Together with the p-electrode pad 62, the n-electrode pad 66 is formed on the upper face of the n-side plated interconnection line 64 on the electrode connection portions 30b to 30d. Finally, the lens 12 is formed on the lower face of the InP substrate 10 facing the light-receiving portion 20. Thus, the semiconductor light-receiving element in accordance with the embodiment of FIG. 2 is made.

In accordance with the embodiment, as illustrated in FIG. 2, a lamination structure of insulating films in which the first SiN film 44 that acts as the first insulating film, the first SiON film 68 and the second SiON film 70 that act as the second insulating film, and the second SiN film 48 acting as the third insulating film are laminated in contact with each other is provided on a part of the side face of the light-receiving portion 20 that is not covered by the resin film 46. The first SiN film 44 and the second SiN film 48 have a tensile stress. The first SiON film 68 and the second SiON film 70 have a compression stress. Therefore, an internal stress of the lamination structure in which these insulating films are laminated is reduced, because the tensile stress and the compression stress cancel with each other. It is therefore possible to reduce the stress applied to the light-receiving portion 20 and suppress fluctuation of light-receiving characteristics.

In the embodiment, the direction of the internal stress of the first SiN film 44 and the second SiN film 48 is opposite to that of the first SiON film 68 and the second SiON film 70. However, each film may have an internal having an internal stress direction (compression stress or tensile stress). When the SiON film and the SiN film have an internal stress having an identical direction, the internal stress of the SiON film can be smaller than that of the SiN film by changing a composition ratio of the SiON film with use of the flow rate of a material gas acting as a deposition parameter. That is, an internal stress of a lamination film having a thickness T in which the SiN film and the SiON film are laminated can be smaller than that of the SiN film having the thickness T. Therefore, an internal stress of insulating films in which the first SiN film 44, the first SiON film 68, the second SiON film 70 and the second SiN film 48 are laminated can be smaller than that of an insulating film having only the SiN film. Therefore, the stress applied to the light-receiving portion 20 can be reduced. In order to reduce the stress applied to the light-receiving portion 20, it is preferable that the direction of the internal stress of the first SiON film 68 and the second SiON film 70 (the second insulating film) is opposite to that of the first SiN film 44 (the first insulating film) or the second SiN film 48 (the third insulating film). In particular, it is preferable that the direction of the internal stress of the first SiN film 44 and the second SiN film 48 is opposite to that of the first SiON film 68 and the second SiON film 70. The structure is not limited to the case where the internal stress of the first SiN film 44 and the second SiN film 48 is a tensile stress, and the internal stress of the first SiON film 68 and the second SiON film 70 is a compression stress, as a case where the internal stress is opposite to each other. The internal stress of the first SiN film 44 and the second SiN film 48 may be a compression stress, and the internal stress of the first SiON film 68 and the second SiON film 70 may be a tensile stress.

The second SiON film 70 (the second insulating film) having the internal stress (compression stress) of which direction is opposite to that of the internal stress (tensile stress) of the resin film 46 is provided on the resin film 46. Thus, the internal stress of the resin film 46 and the internal stress of the second SiON film 70 cancel with each other. Therefore, a peeling or a cracking of the resin film 46 and the second SiON film 70 can be suppressed. It is therefore preferable that an insulating film provided on the resin film 46 has an internal stress of which direction is opposite to that of the internal stress of the resin film 46.

The resin film 46 may not be a material having a tensile stress but may be a material having a compression stress. The insulating film provided on the resin film 46 may not be a SiON film but a SiN film, when the direction of the internal stress of the insulating film provided on the resin film 46 is opposite to that of the resin film 46. In this case, the insulating film in which a SiN film, a SiON film and another SiN film are laminated can be formed on the side face of the light-receiving portion 20. It is preferable that the resin film 46 has an internal stress of which direction is the same as that of the first SiN film 44 and the second SiN film 48. In this case, a SiON film is provided on the resin film 46, and a thickness of the SiON film provided on the side face of the light-receiving portion 20 can be enlarged. Therefore, the stress applied to the light-receiving portion 20 can be reduced.

The first SiN film 44 and the first SiON film 68 are provided under the resin film 46. As mentioned above, the adhesiveness between the resin film 46 and a semiconductor layer can be improved and the semiconductor layer can be protected, because the first SiN film 44 and the first SiON film 68 are provided. When only the adhesiveness between the resin film 46 and the semiconductor layer and the protection of the semiconductor are considered, only the first SiON film 68 may be provided without the first SiN film 44. However, in view of a surface leakage and a current suppression of the semiconductor layer, it is preferable that the first SiN film 44 is provided. And, as illustrated in FIG. 4B, oxidation of the p-side ohmic electrode 50 and the n-side ohmic electrode 54 can be suppressed in the formation process of the resin film 46, because the first SiON film 68 covers the p-side ohmic electrode 50 and the n-side ohmic electrode 54. It is therefore preferable that the first SiON film 68 is provided on the first SiN film 44. That is, it is preferable that the insulating film under the resin film 46 includes the first SiN film 44 and the first SiON film 68.

As illustrated in FIG. 2, the insulating film under the resin film 46 includes the first SiON film 68, and the insulating film on the resin film 46 includes the second SiON film 70. That is, the second insulating film made of the first SIGN film 68 and the second SiON film 70 has a two-layer structure sandwiching the resin film 46. Therefore, the first SiON film 68 and the second SiON film 70 are laminated on the light-receiving portion 20. In this structure, it is preferable that the first SiON film 68 under the resin film 46 and the second SiON film 70 on the resin film 46 have an identical composition ratio (a ratio of oxygen and nitrogen is identical). Thus, as illustrated in FIG. 4C, the opening 90a can be stably formed, when the first SiON film 68 and the second SiON film 70 on an electrode on the light-receiving portion 20 are subjected to an etching process with use of a common mask. It is preferable that an interconnection line is connected to the electrode via the opening 90a. For example, when the composition ratio of the first SiON film 68 is different from that of the second SiON film 70, an etching rate is different from each other. In this case, a cavity may be formed during forming the opening 90a.

The insulating film under the resin film 46 may have a structure in which not a SiON film but a SiN film is laminated on the first SiN film 44, and the SiN film may be covered by the p-side ohmic electrode 50 and the n-side ohmic electrode 54. In this case, the oxidation of the p-side ohmic electrode 50 and the n-side ohmic electrode 54 can be suppressed. And, in this case, an insulating film in which a SiN film, a SiON film and a SiN film are laminated can be formed on the side face of the light-receiving portion 20. However, in order to enlarge the thickness of the SiON film provided on the side face of the light-receiving portion 20 and reduce the stress applied to the light-receiving portion 20, it is preferable that the SiON film is provided on the first SiN film 44.

As illustrated in FIG. 5B, it is preferable that the second SiN film 48 covering the second SiON film 70 on the side face of the light-receiving portion 20 and the second SiN film 48 in contact with the upper face of the light-receiving portion 20 are formed together with each other. As mentioned above, the light reflected by the metal layer 58 passes through the second SiN film 48 on the upper face of the light-receiving portion 20. The reflection characteristics may be improved, because the film through which the light passes is a silicon nitride film. A manufacturing process may be shortened when the second SiN film 48 achieving the improved reflection characteristics and the second SiN film 48 acting as the passivation film protecting the whole of the semiconductor light-receiving element 100 are formed together with each other.

In the embodiment, the first SiN film 44 and the first SiON film 68 are provided under the resin film 46, and the second SiON film 70 is provided on the resin film 46. However, the structure is not limited. The resin film 46 has only to be sandwiched in or between any of the first SiN film 44 (the first insulating film), the first SiON film 68, the second SiON film 70 (the second insulating film) and the second SiN film 48 (the third insulating film).

In the embodiment, the light-receiving portion 20 is a photo diode of a p-n junction diode type in which the n-type InP layer 22, the n-type InGaAs layer 24, the n-type InGaAsP layer 25 and the p-type InP layer 26 are laminated in this order. However, the structure is not limited. For example, the light-receiving portion 20 may be a p-i-n photo diode in which an n-type semiconductor layer, an intrinsic semiconductor layer, and a p-type semiconductor layer are laminated. The composition ratio of the first SiN film 44, the first SiON film 68, the second SiON film 70 and the second SiN film 48 is not limited to a specific value and may be a various value.

The material of each semiconductor layer structuring the light-receiving portion 20 is not limited to the above-mentioned material and may be other materials. A semi-insulating substrate other than the InP substrate 10 may be used. Further, in the embodiment, a back-face incident type semiconductor light-receiving element is described. However, a from-face incident type semiconductor light-receiving element may be used.

The present invention is not limited to the specifically disclosed embodiments and variations but may include other embodiments and variations without departing from the scope of the present invention.

What is claimed is:

1. A semiconductor light-receiving element comprising:
   a light-receiving portion that is provided on a semi-insulating substrate and has a mesa shape in which semiconductor layers are laminated;
   a lamination structure of insulating films that is provided on a part of a side face of the light-receiving portion and has a structure in which a first insulating film comprised of a silicon nitride film, a second insulating film comprised of a silicon oxynitride film and a third insulating film comprised of a silicon nitride film are laminated in contact with each other; and
   a resin film that is provided adjacent to the light-receiving portion,
   the resin film being sandwiched in or between any of the first insulating film, the second insulating film and the third insulating film.

2. The semiconductor light-receiving element claimed in claim 1, wherein a direction of an internal stress of the second insulating film is opposite to that of the first insulating film or the third insulating film.

3. The semiconductor light-receiving element claimed in claim 1, wherein:
   the second insulating film is provided on the resin film; and
   a direction of the internal stress of the second insulating film is opposite to that of the resin film.

4. The semiconductor light-receiving element claimed in claim 1, wherein the second insulating film has a two-layer structure sandwiching the resin film.

5. The semiconductor light-receiving element claimed in claim 4, wherein:
   the two-layer structure structuring the second insulating film is located on an electrode provided on the light-receiving portion; and
   an interconnection line is connected to the electrode via a window that is formed by opening the two-layer structure with use of a common mask.

6. The semiconductor light-receiving element claimed in claim 1, wherein a region of the lamination structure of insulating films having the third insulating film without the first insulating film and the second insulating film is provided on an upper face of the light-receiving portion.

7. The semiconductor light-receiving element claimed in claim 4, wherein the two-layer structure and the resin film are formed on the first insulating film.

8. The semiconductor light-receiving element claimed in claim 4, further comprising a first interconnection line provided on the second insulating film,
   wherein the third insulating film is provided on the first interconnection line.

9. The semiconductor light-receiving element claimed in claim 8, further comprising:
   an electrode connection portion that is provided on the semi-insulating substrate and has a dummy mesa structure in which semiconductor layers are laminated;
   a lamination structure of insulating films that is provided on a part of a side face of the electrode connection portion and has a structure in which the first insulating film, the second insulating film and the third insulating film are laminated in contact with each other; and
   a second interconnection line that is provided on the electrode connection portion and is connected to the first interconnection line.

10. The semiconductor light-receiving element claimed in claim 9, wherein:
    a groove is formed on the semi-insulating substrate around the light-receiving portion and the electrode connection portion; and
    the first insulating film and the second insulating film are provided on the groove.

* * * * *